United States Patent
Hicks et al.

(10) Patent No.: US 11,098,526 B2
(45) Date of Patent: *Aug. 24, 2021

(54) SYSTEM AND METHOD FOR INSTALLING A TRANSPARENT ORGANIC LIGHTING DIODE (TOLED) DISPLAY WITH TRANSPARENCY CONTROL ON ARCHITECTURAL GLASS

(71) Applicant: LUSID, LLC, Irvine, CA (US)

(72) Inventors: Rodrigo Mier Hicks, Irvine, CA (US); Kevin Kim, Irvine, CA (US)

(73) Assignee: LUSID, LLC, Irvine, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 16/862,502

(22) Filed: Apr. 29, 2020

(65) Prior Publication Data
US 2020/0256118 A1 Aug. 13, 2020

Related U.S. Application Data

(63) Continuation-in-part of application No. 16/392,507, filed on Apr. 23, 2019, now Pat. No. 10,699,604.
(Continued)

(51) Int. Cl.
*H05K 5/00* (2006.01)
*H05K 5/02* (2006.01)
(Continued)

(52) U.S. Cl.
CPC ............. *E06B 7/28* (2013.01); *E05D 7/10* (2013.01); *E06B 9/24* (2013.01); *G02F 1/157* (2013.01);
(Continued)

(58) Field of Classification Search
CPC ...... E06B 7/28; E06B 9/24; E06B 2009/2464; H05K 5/03; H05K 5/0017; H05K 5/0226; G02F 2201/44; G02F 1/1533; G02F 1/157; H01L 51/5237; G06F 3/044; G06F 3/0416; E05D 5/12; E05D 5/0246; E05D 2007/1027; E05D 7/1005; E05D 11/06;
(Continued)

(56) References Cited

U.S. PATENT DOCUMENTS 8,281,459 B2 * 10/2012 Le .................... E05D 3/022
16/374
2003/0151339 A1 * 8/2003 Reed ................ E05D 11/1078
312/405
(Continued)

*Primary Examiner* — Abhishek M Rathod
(74) *Attorney, Agent, or Firm* — Blue Capital Law Firm, P.C.

(57) ABSTRACT

A system and method for removable or semi-permanent installation of a transparent organic lighting diode (TOLED) display with transparency control are disclosed. In one embodiment, the system includes a TOLED display that includes a TOLED panel with a front side and a back side, a cover glass coupled to the front side of the TOLED panel, and an electrochromic (EC) glass coupled to the back side of the TOLED panel to provide transparency control of the TOLED panel. The system further includes a top hinge assembly and a bottom hinge assembly used to rotatably couple the TOLED display to a support structure to facilitate rotation of the TOLED display to different positions and to provide relatively easy removal of the TOLED display.

8 Claims, 31 Drawing Sheets

Related U.S. Application Data

(60) Provisional application No. 62/951,912, filed on Dec. 20, 2019, provisional application No. 62/776,639, filed on Dec. 7, 2018, provisional application No. 62/721,971, filed on Aug. 23, 2018, provisional application No. 62/713,328, filed on Aug. 1, 2018.

(51) Int. Cl.

| | | |
|---|---|---|
| *G06F 3/044* | (2006.01) | |
| *G09F 9/33* | (2006.01) | |
| *H05K 5/03* | (2006.01) | |
| *E06B 7/28* | (2006.01) | |
| *G02F 1/153* | (2006.01) | |
| *G02F 1/157* | (2006.01) | |
| *H01L 51/52* | (2006.01) | |
| *E06B 9/24* | (2006.01) | |
| *E05D 7/10* | (2006.01) | |
| *G09F 23/00* | (2006.01) | |
| *G06F 3/041* | (2006.01) | |
| *E05D 5/12* | (2006.01) | |

(52) U.S. Cl.
CPC ............ *G02F 1/1533* (2013.01); *G06F 3/044* (2013.01); *G09F 9/33* (2013.01); *G09F 23/00* (2013.01); *H01L 51/5237* (2013.01); *H05K 5/0017* (2013.01); *H05K 5/0226* (2013.01); *H05K 5/03* (2013.01); *E05D 5/12* (2013.01); *E05Y 2900/148* (2013.01); *E05Y 2900/606* (2013.01); *E06B 2009/2464* (2013.01); *G02F 2201/44* (2013.01); *G06F 3/0416* (2013.01)

(58) Field of Classification Search
CPC ......... E05Y 2900/606; E05Y 2800/672; G09F 23/00; G09F 19/226; G09F 9/33
See application file for complete search history.

(56) References Cited

U.S. PATENT DOCUMENTS

| | | | |
|---|---|---|---|
| 2012/0105424 A1* | 5/2012 | Lee ..................... | G09F 13/0413 345/212 |
| 2012/0285089 A1* | 11/2012 | Artwohl ................ | A47F 3/0434 49/70 |
| 2013/0063326 A1* | 3/2013 | Riegel ............... | G02F 1/133615 345/4 |
| 2013/0157493 A1* | 6/2013 | Brown ...................... | E06B 3/66 439/247 |
| 2014/0144083 A1* | 5/2014 | Artwohl ................ | G09F 23/065 49/70 |
| 2014/0177028 A1* | 6/2014 | Shrivastava ......... | B23K 26/359 359/275 |
| 2014/0192017 A1* | 7/2014 | Yang ..................... | G06F 3/1423 345/174 |
| 2015/0002006 A1* | 1/2015 | Segroves ............... | H05K 7/183 312/236 |
| 2016/0220039 A1* | 8/2016 | Chang ................... | A47F 3/0486 |
| 2016/0344148 A1* | 11/2016 | Mullins .................... | E06B 3/42 |
| 2017/0089632 A1* | 3/2017 | Kang ..................... | A47F 3/0434 |
| 2017/0257956 A1* | 9/2017 | An ........................ | A47F 3/0434 |
| 2018/0025679 A1* | 1/2018 | Park ..................... | A47F 3/0434 345/156 |
| 2020/0057421 A1* | 2/2020 | Trikha .............. | B32B 17/10036 |

\* cited by examiner

SYSTEM AND METHOD FOR INSTALLING A TRANSPARENT ORGANIC LIGHTING DIODE (TOLED) DISPLAY WITH TRANSPARENCY CONTROL ON ARCHITECTURAL GLASS

CROSS-REFERENCE TO RELATED APPLICATIONS

This application is a Continuation-In-Part of U.S. application Ser. No. 16/392,507, filed on Apr. 23, 2019, which claims the benefit of U.S. Provisional Patent Application Ser. No. 62/951,912 filed on Dec. 20, 2019, U.S. Provisional Patent Application Ser. No. 62/776,639, filed on Dec. 7, 2018, U.S. Provisional Patent Application Ser. No. 62/721,971, filed on Aug. 23, 2018, and U.S. Provisional Patent Application Ser. No. 62/713,328, filed on Aug. 1, 2018, the entire disclosures of which are incorporated herein in its entirety by reference.

FIELD

This disclosure generally relates to TOLEDs, and more particularly, to a system and method for installing a TOLED display with transparency control on architectural glass.

BACKGROUND

TOLED is a display technology that uses transparent electrodes and light emitting materials. TOLED embeds OLED technology in thin, transparent glass or plastic substrates that are capable of emitting light from the top or bottom, or both. Because TOLED displays that emit from both top and bottom are 70% transparent when not in use, they could be incorporated into many useful applications.

As an example, the TOLED displays can be used in shopping windows (or other architectural glasses). The shopping windows show the product on the inside as well as show text or advertisements on the glass. For example, there could be a pair of shoes behind the window and at the same time the window has information scrolling across it like prices, special deals, or advertisement video clips. This type of showcase is becoming more popular as see-through screens are becoming cheaper and more available.

Currently, several bonding methods exist to install displays onto architectural glass. However, they all share the trait that the installation is permanent. Trying to remove a display from architectural glass when installed with current available bonding methods is a very risky process, which most of the time leads to damage to the display, the glass, or both. Due to the shorter use life that TOLEDs possess (~3 years) in comparison with architectural glass (~12+ years), it is imminent that TOLED maintenance or replacement will be a necessity for the user. Therefore, it would be beneficial to have a system and method to semi-permanently install TOLED displays on architectural glass (such as windows) in a reworkable/removable, efficient, and aesthetically pleasing manner.

Furthermore, it would be advantageous to have a system and method to install the TOLED assembly on a support structure rather directly on the architectural glass so that the TOLED assembly could be installed on or attached to any surface that is structurally sound to support the proposed TOLED assembly. In addition, it would be advantageous to have a system and method to construct the TOLED assembly with transparency control.

SUMMARY

A system and method for removable or semi-permanent installation of a transparent organic lighting diode (TOLED) display with transparency control are disclosed. In one embodiment, the system includes a TOLED display that includes a TOLED panel with a front side and a back side, a cover glass coupled to the front side of the TOLED panel, and an electrochromic (EC) glass coupled to the back side of the TOLED panel to provide transparency control of the TOLED panel. The system also includes a top hinge assembly and a bottom hinge assembly used to rotatably couple the TOLED display to a support structure to facilitate rotation of the TOLED display to different positions and to provide relatively easy removal of the TOLED display.

DETAILED DESCRIPTION

Figure 1:
FIG. 1 shows an exemplary installation of a video wall consisting of multiple TOLED displays in portrait mode on an architectural glass or window according to one exemplary embodiment.
Figure 2:
FIG. 2 illustrates an exemplary installation of a TOLED display in landscape mode on an architectural glass or window according to one exemplary embodiment.

FIG. 1 shows an exemplary installation 100 of a video wall consisting of multiple TOLED displays 105a and 105b in portrait mode on an architectural glass or window according to one exemplary embodiment. FIG. 2 illustrates an exemplary installation 200 of multiple TOLED displays 205a and 205b in landscape mode on an architectural glass or window according to one exemplary embodiment.

Figure 3:
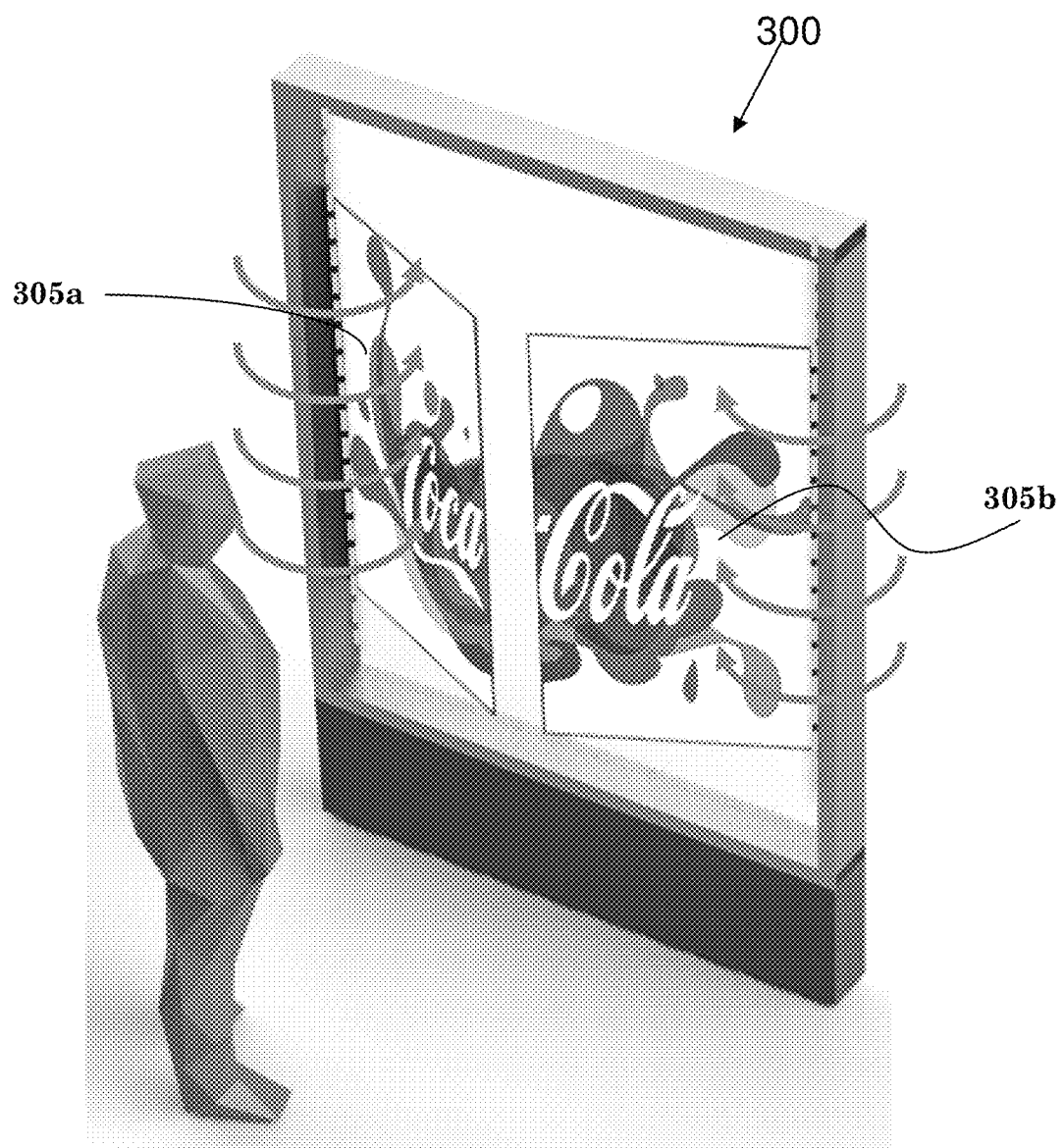
FIG. 3 shows an exemplary frame-less installation system with multiple TOLED displays and in portrait mode on an architectural glass or window according to one exemplary embodiment.

FIG. 3 shows an exemplary frame-less installation system 300 with multiple TOLED displays 305a and 305b in portrait mode on an architectural glass or window according to one exemplary embodiment. As illustrated in FIG. 3, the frame-less installation system 300 allows for narrow borders between the TOLED displays 305a and 305b that would provide a better overall image. In one embodiment, multiple TOLEDs (in either landscape or portrait) can be combined into a video wall, as long as the glass and the supporting frame are big enough to fit the displays.

Figure 4:
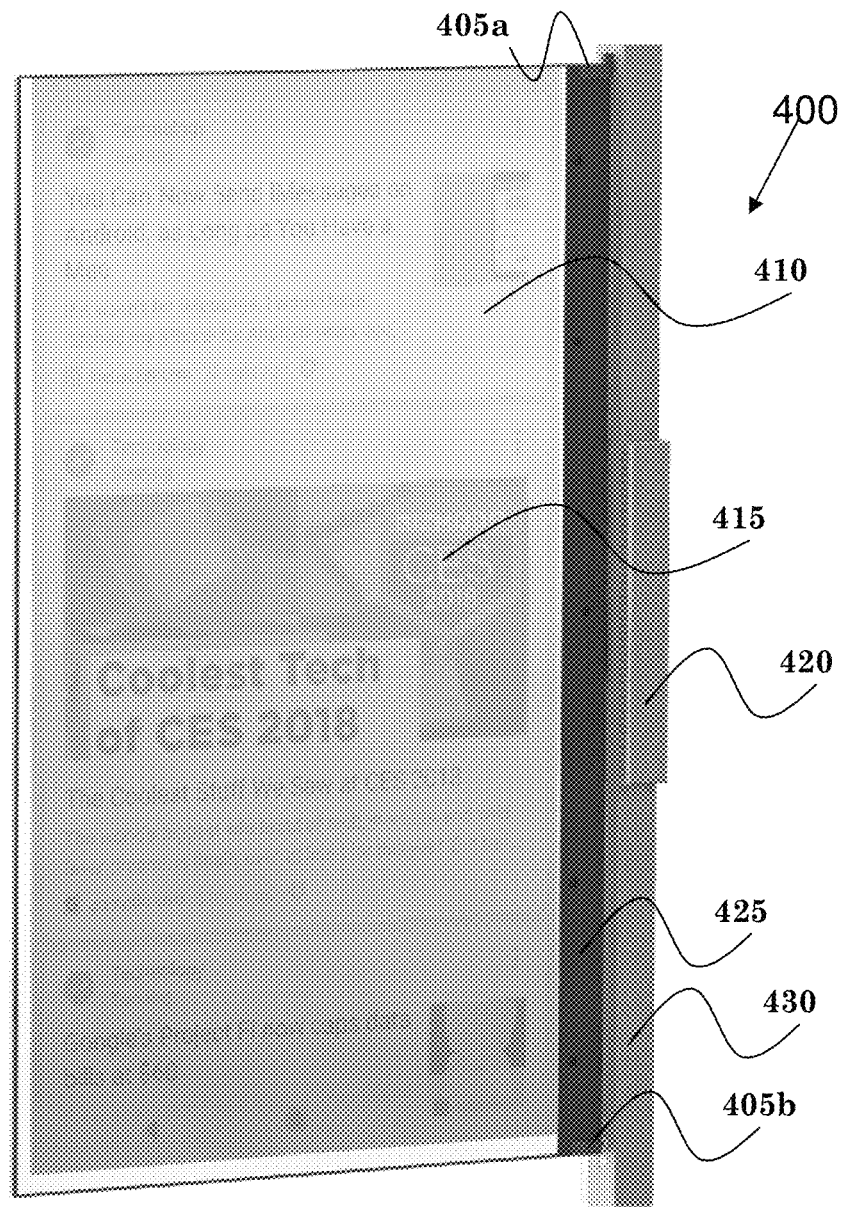
FIG. 4 illustrates an exemplary installation with one TOLED panel according to one exemplary embodiment.

FIG. 4 illustrates an exemplary installation 400 with one TOLED panel 410 according to one exemplary embodiment. In general, hinge assemblies 405a and 405b facilitates installation and removal of the TOLED panel 410 on the architectural glass or window support structure (or mullion). The optical bonding 415 combines the cover glass and the TOLED cell into a single robust part. In one embodiment, the electronics (which used to power and control the TOLED panel) 420 could be housed inside the window's frame or mullion 430. The cover glass 425 with thru holes is bonded to the TOLED panel 410 and then mounted (e.g., screwed) on the window's frame or mullion 430 via hinge assemblies 405a and 405b.

Figure 5:
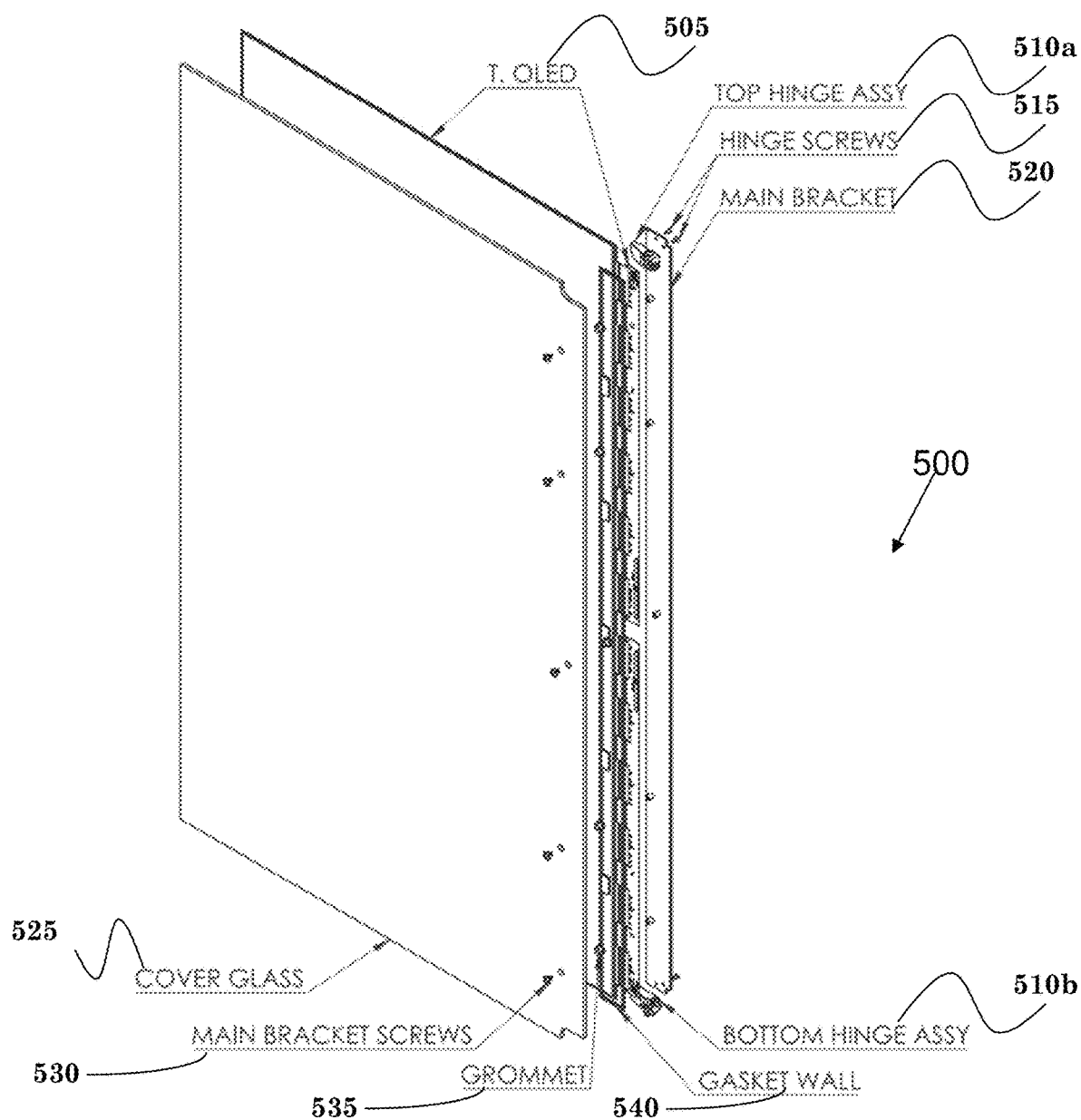
FIG. 5 shows an exploded view of a TOLED display assembly according to one exemplary embodiment.

FIG. 5 shows an exploded view of a TOLED display assembly 500 according to one exemplary embodiment. The TOLED display assembly 500 includes a top hinge assembly 510a and a bottom hinge assembly 510b used to mount the assembly 500 onto an architectural glass or window support structure (or mullion). Hinge screws or fasteners 515 are used to attach the hinge assemblies 510a and 510b to the main bracket 520. Various alternative hinge assemblies are shown in FIGS. 6A-6C and 7A-7C, and FIGS. 13A, 14A-14D, 15, and 16, and are described in further detail below. Main bracket screws or fasteners 530 passes through holes on the cover glass 525 and grommets 535 to bind the cover glass 525 together with the TOLED panel 505 and the gasket wall 540, and to fasten these components to the main bracket 520.

Figure 6A:
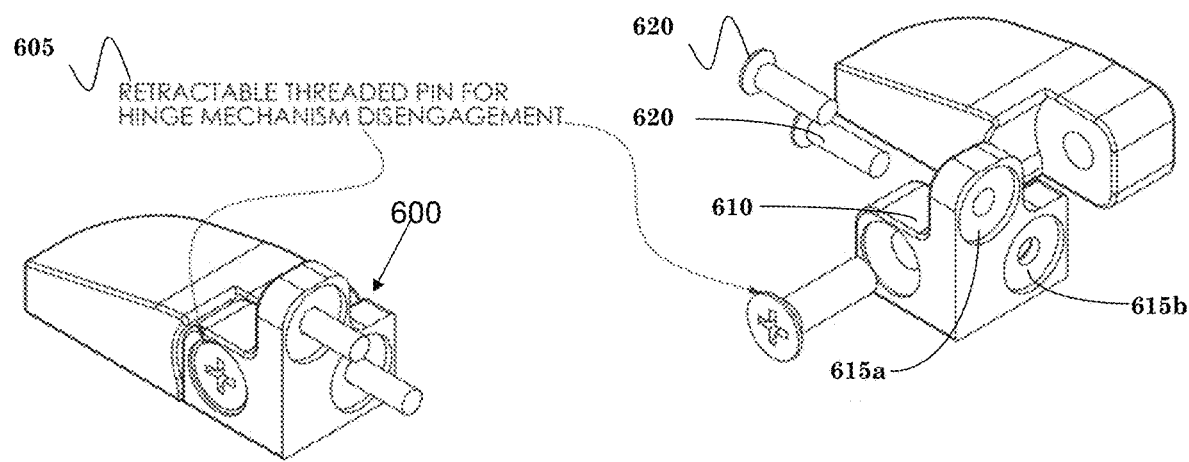
FIGS. 6A-6C show different views of a hinge mechanism assembly according to one exemplary embodiment.

FIG. 6A shows a perspective view and an exploded view of a hinge mechanism assembly 600 according to one exemplary embodiment. As shown in FIG. 6A, the hinge mechanism assembly 600 includes retractable threaded pin 605 for engagement or disengagement of the hinge mechanism 635, a bottom portion (or hinge base) 610 with cavities 615a and 615b to allow a flush mount when using rivet nuts, and mounting screws 620 for mounting the hinge mechanism assembly 600 on a supporting structure (such as a mullion supporting a window).

Figure 6B:
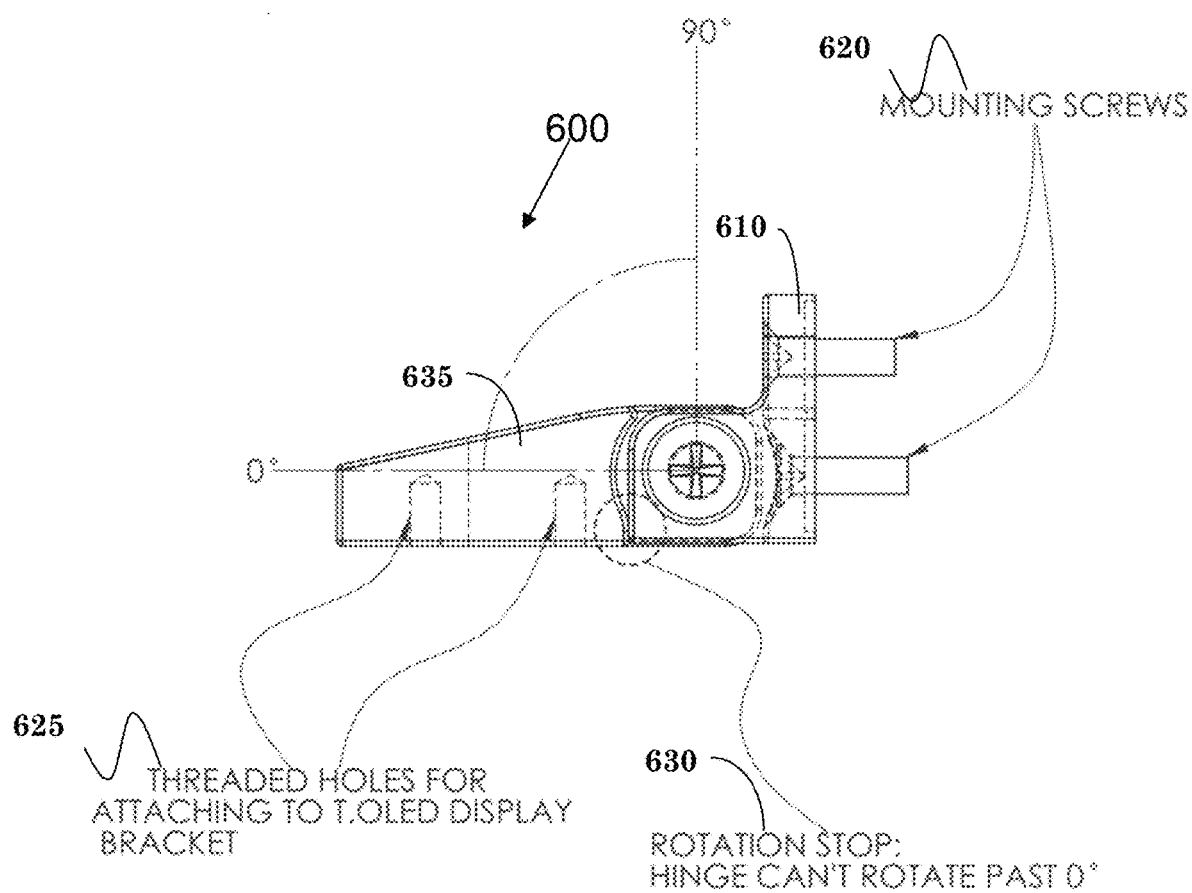

FIG. 6B shows a side view of the hinge mechanism assembly 600 according to one exemplary embodiment. As shown in FIG. 6B, the hinge mechanism assembly 600 includes a top portion (or hinge mechanism) 635 with thread holes 625 for attaching to the TOLED panel or display bracket (shown as element 520 in FIG. 5), and a rotation stop portion 630 to prevent the hinge mechanism (or top portion) 635 from rotating past zero degree.

Figure 6C:
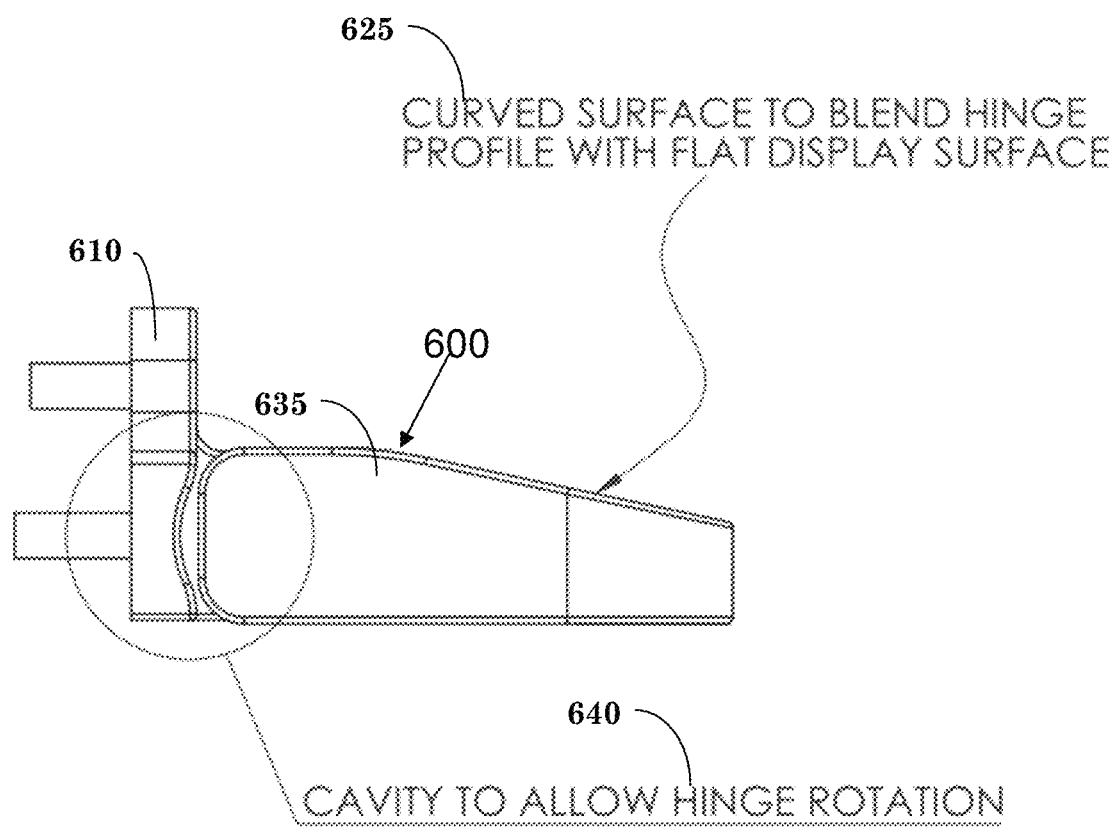

FIG. 6C shows another side view of the hinge mechanism assembly 600 according to one exemplary embodiment. As shown in FIG. 6B, the bottom portion (or hinge base) 610 of the hinge mechanism assembly 600 includes cavity 640 to allow the hinge mechanism 635 to rotate. Furthermore, the top portion (or hinge mechanism) 635 of the hinge mechanism assembly 600 has a curved surface to blend the profile of the hinge mechanism 635 with the flat display surface.

Figure 7A:
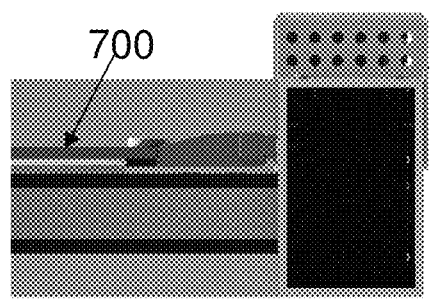
FIGS. 7A-7C illustrate a TOLED display assembly being rotated in various positions in according to one exemplary embodiment.
Figure 7B:
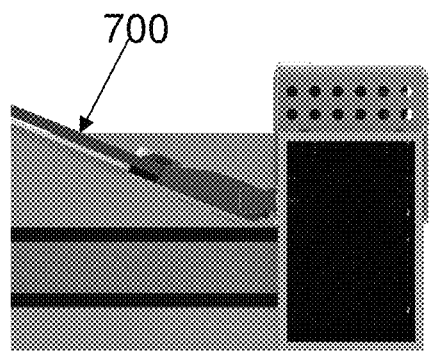
Figure 7C:
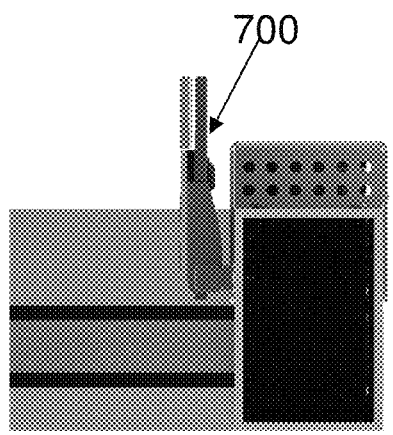

When using the hinge mechanism assembly 600 to mount a TOLED display assembly (shown as element 500 in FIG. 5), the hinge mechanism assembly 600 allows a TOLED display assembly to be rotated to various positions, such as a close (or zero degree) position as shown in FIG. 7A, a partially open position as shown in FIG. 7B, or an open (or ninety degrees) position as shown in FIG. 7C.

Figure 8A:
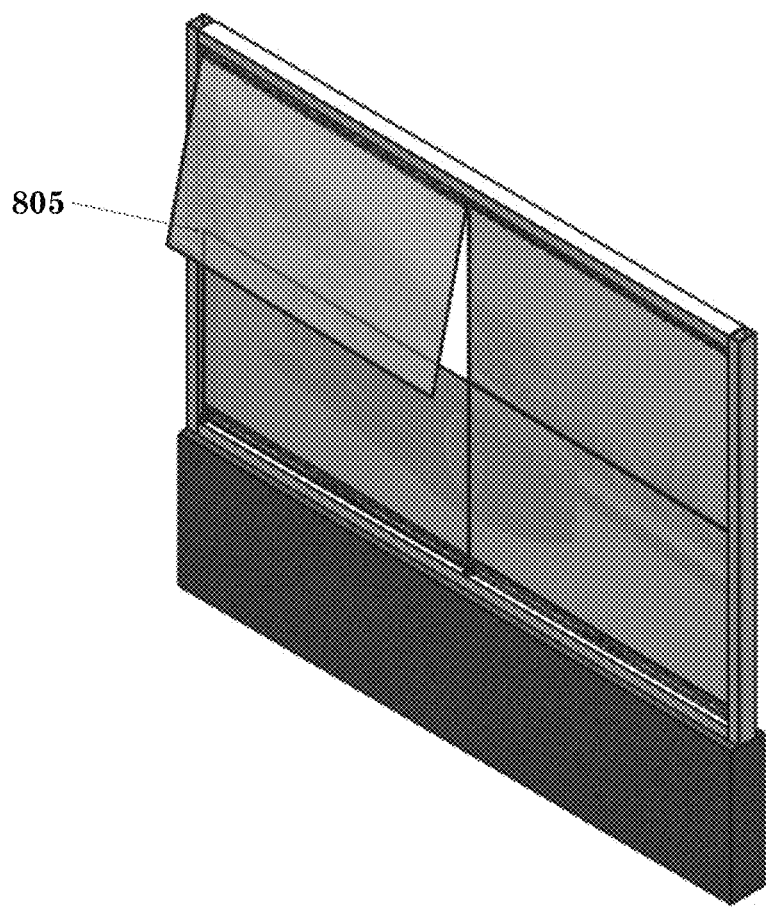
FIGS. 8A and 8B illustrate an installation of a video wall with four (4) TOLED screens on a window according to one exemplary embodiment.
Figure 8B:
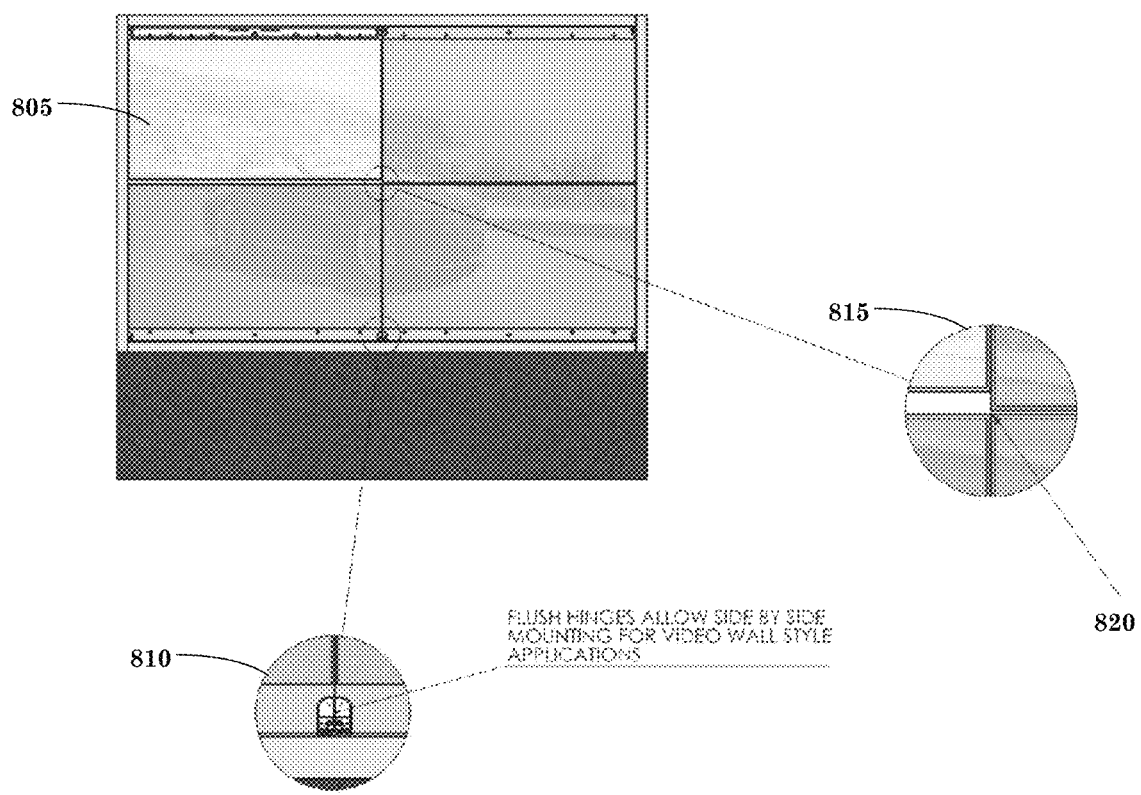

FIGS. 8A and 8B illustrate an installation of a video wall with four (4) TOLED screens on a window using the hinge mechanism assembly 600 (shown in FIGS. 6A-6C) according to one exemplary embodiment. As installed, the TOLED screens 805 could be rotated and raised up (as shown in FIG. 8A) to allow each maintenance of each individual TOLED screen and to also allow access to the window for various purposes (such as cleaning the window). As shown in FIG. 8B, flush hinges 810 allow side by side mounting for video wall style applications. As shown in blown up portion 815, a glass holder piece 820 could be inserted near the intersection corners of the TOLED screen to add rigidity to the video wall.

Figure 9:
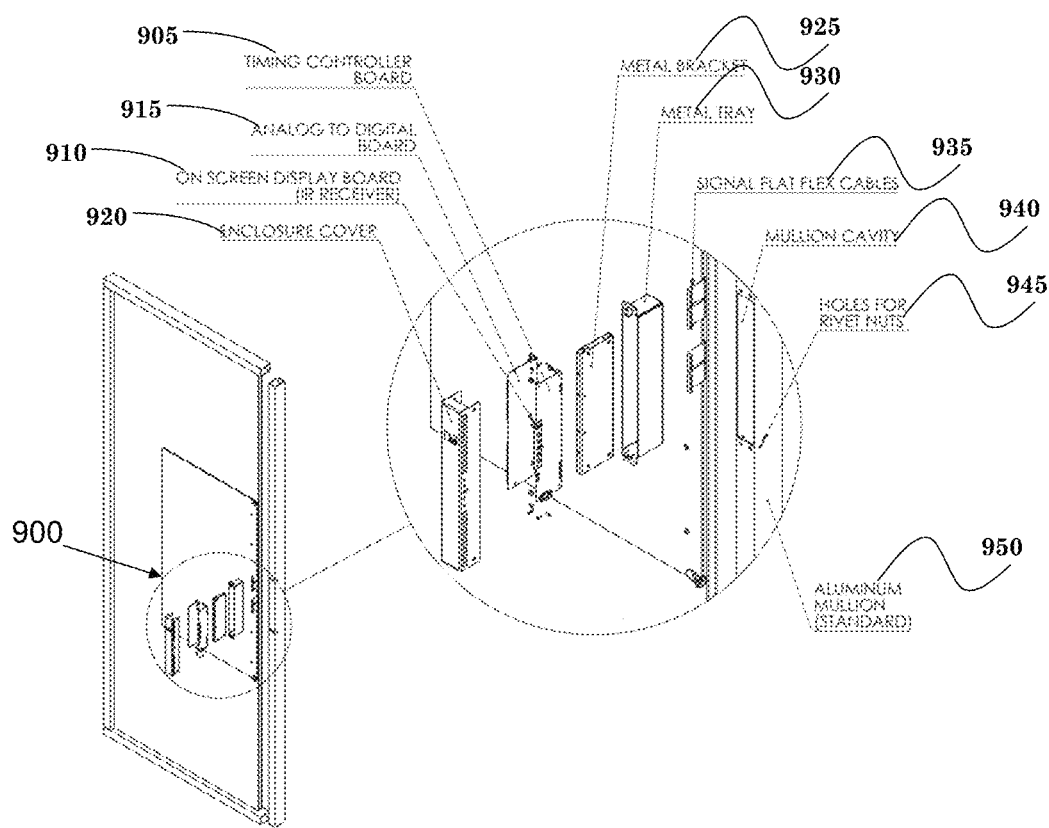
FIG. 9 illustrates an installation where the electronic boards assembly used to control the TOLED screens are installed onto a mullion according to one exemplary embodiment.

FIG. 9 illustrates an installation where the electronic boards assembly 900 used to control the TOLED screens are installed onto the mullion 950 according to one exemplary embodiment. The timer controller board 905, the on-screen display board (IR receiver) 910, and the analog to digital board 915 are mounted on the metal bracket 925, and the mounted electronic board assembly is inserted into the metal tray 930 which is then inserted into the mullion cavity 940. The enclosure cover 920 is mounted on the mullion 950 to cover the mullion cavity 940. In one embodiment, the mullion 950 has holes 945 for rivet nuts or other types of fasteners that are used to fasten the enclosure cover 920 onto the mullion 950. Depending on the dimensions of the mullion, the electronic board assembly may protrude from or sit flush in the mullion. The control box design can be adjusted for both scenarios by changing the enclosure cover 920.

Figure 10:
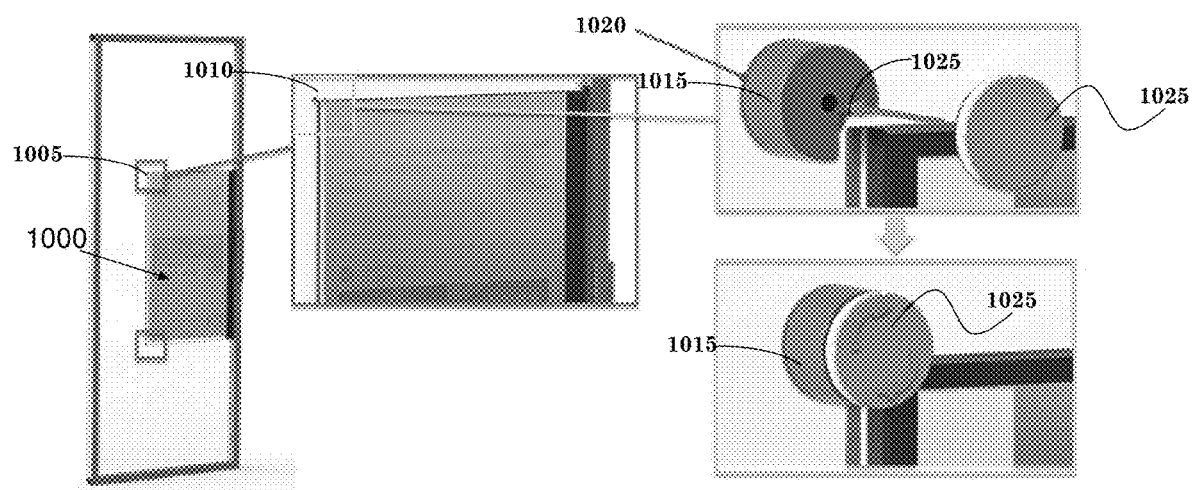
FIG. 10 illustrates an installation of a TOLED screen according to one exemplary embodiment.

FIG. 10 illustrates an installation of a TOLED screen 1000 according to one exemplary embodiment. As shown in blown-up corner portions 1005 and 1010, the installation uses an exemplary hinge stop 1020 to hold the TOLED screen 1000 in place. The hinge stop 1020 has a bottom portion 1015 with a cut-out portion 1025 to receive a corner of the TOLED screen 1000. A top portion 1025 of the hinge stop 1020 is then inserted to hold the TOLED screen 1000 in place.

Figure 11A:
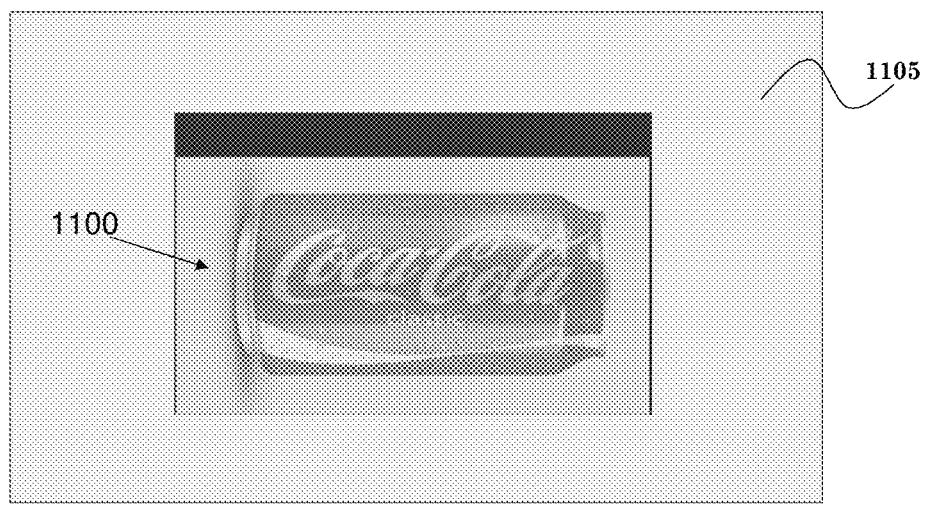
FIGS. 11A-11D illustrate an installation of a TOLED display assembly onto a window using a magnetic hinge according to one exemplary embodiment.
Figure 11B:
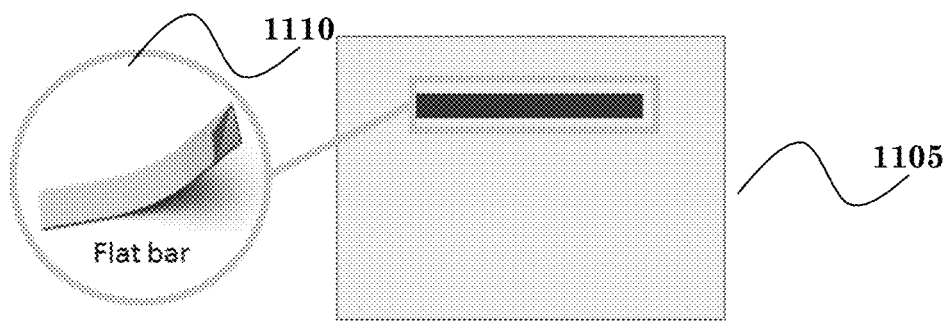
Figure 11C:
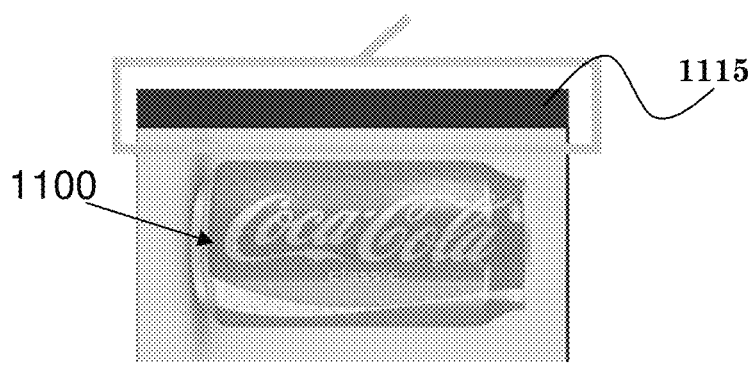
Figure 11D:
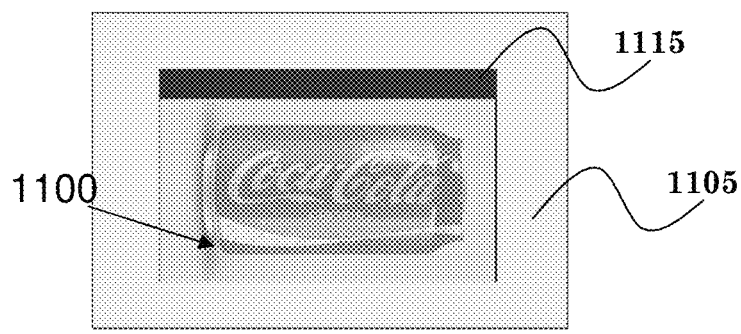

FIGS. 11A-11D illustrate an installation of a TOLED display assembly 1100 onto a window 1105 using a magnetic hinge according to one exemplary embodiment. As shown in FIG. 11B, a metal flat bar 1110 is bonded to the window with optical bond or double sided tape. As shown in FIG. 11C, a magnetic film 1115 is applied to back of the TOLED display assembly 1100. As shown in FIG. 11D, the TOLED display assembly is attached via magnetic force to the metal flat bar 1110 on the window 1105.

Figure 12A:
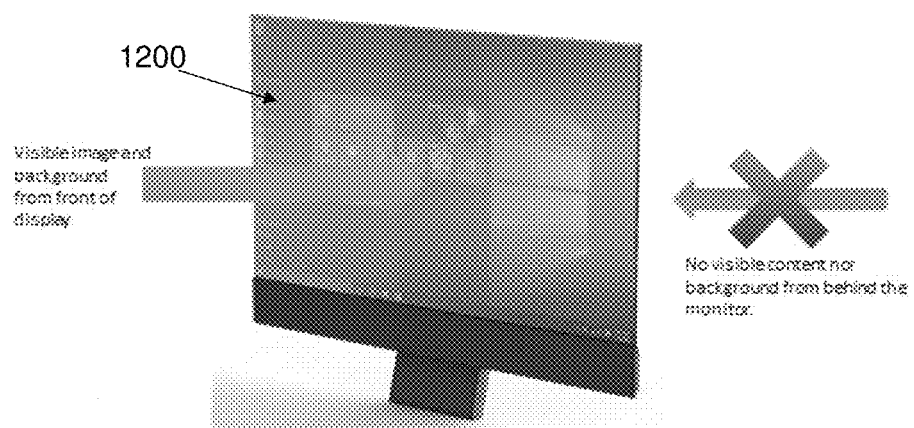
FIGS. 12A-12B illustrate a one-way TOLED display assembly according to one exemplary embodiment.
Figure 12B:
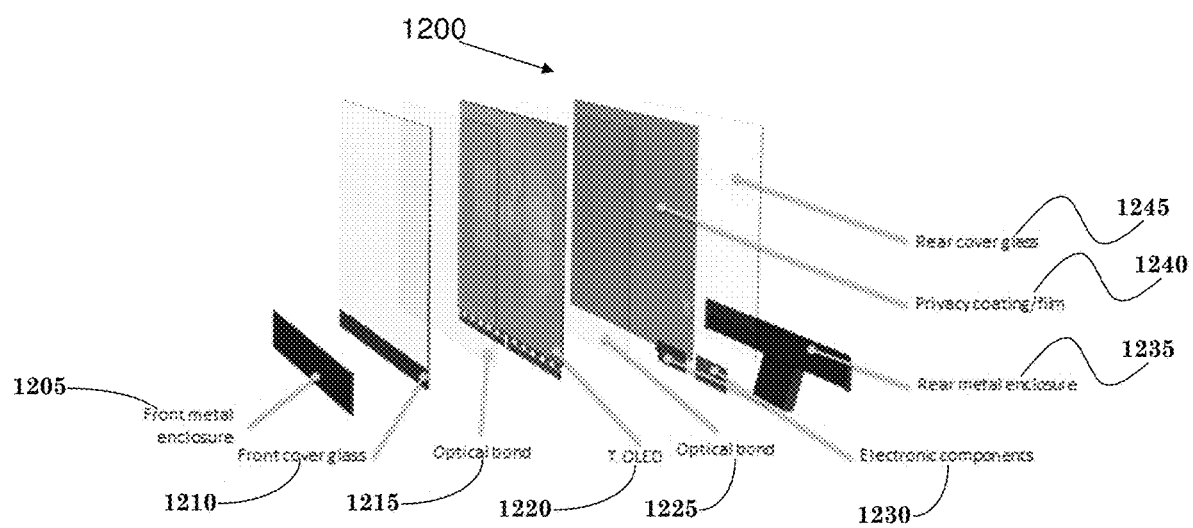

FIGS. 12A-12B illustrate a one-way TOLED display assembly 1200 according to one exemplary embodiment. As shown in FIG. 12A, the one-way TOLED display provides visible image and background from the front of the display, while there is no visible content or background from the back of the display. As shown in FIG. 12B, the front of the one-way TOLED assembly 1200 includes a front optical bond layer 1215 used to bond the TOLED panel 1220 to the front cover glass 1210 which is then attached to the front metal enclosure. The back of the one-way TOLED assembly 1200 includes a back optical bond layer 1225 used to bond a private coating/film to the TOLED panel 1220. A rear metal enclosure 1235 is used to bind the rear cover glass 1245 with the TOLED panel 1220 (along with the bonded private coating/film 1240). The private coating/film 1240 blocks visibility of content or background from the back of the display.

In general, TOLED panels are usually brighter when viewed from the front than from the back. This has to do with the way OLED technology works, where each pixel consists of a discrete LED pointed towards the front. Although traces of an image can still be slightly seen from the back of the TOLED panel, the image is dull and difficult to see from the back of the TOLED. However, the image can still be seen from the back of the TOLED panel when observed carefully. A privacy film or a light mirror-like tint can be applied to the back of the T.OLED panel to remove or block any traces of the image, thus making the TOLED panel transparent only one-way (from the front).

In one embodiment, to achieve the one-way transparency TOLED, a silver reflective mirror film with a light 50% to 70% tint (or lower, depending on the end user application) could be applied to the back of the T.OLED. The mirror like appearance of the film reflects (or deflects) incoming light and makes it difficult to see the TOLED image content from the back of the TOLED.

Figure 13A:
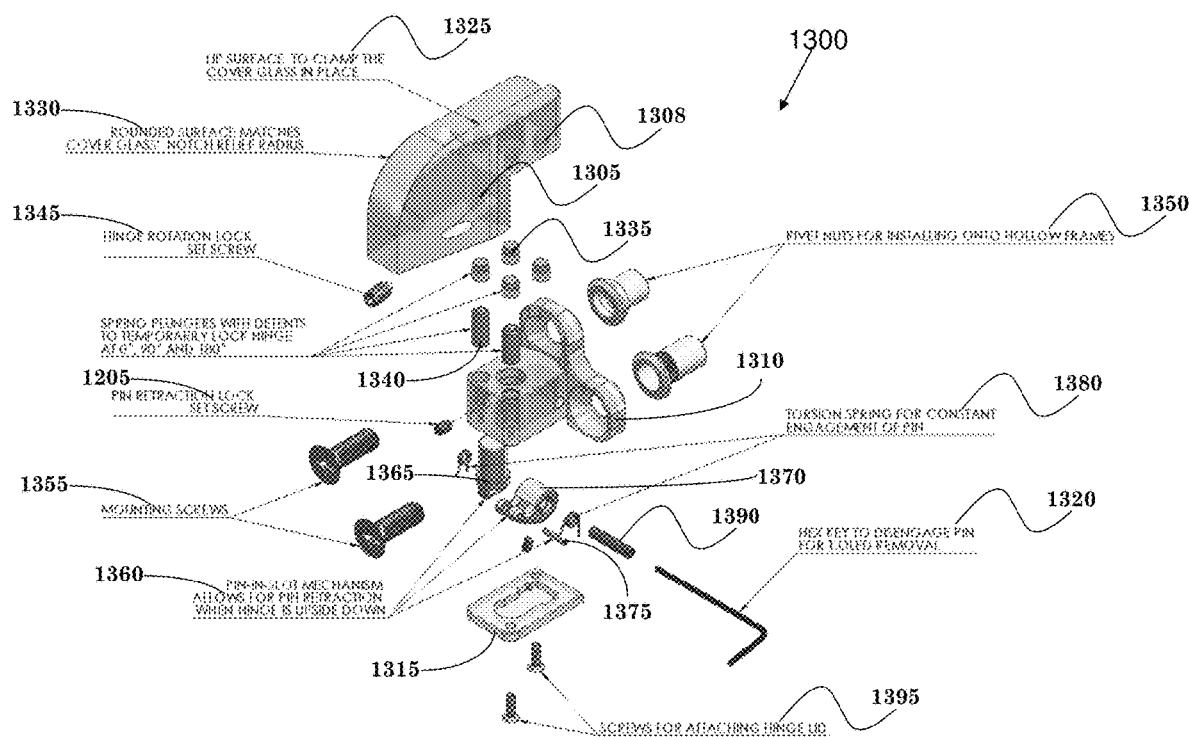
FIG. 13A is an exploded view of an alternative hinge assembly (in a disassembled state) with a hex key for TOLED display removal according to one exemplary embodiment.

FIG. 13A shows an exploded view of an alternative hinge assembly 1300 with a hex key 1320 to disengage a hinge pin for removal of the TOLED display assembly according to one exemplary embodiment. The hinge assembly 1300 includes a hinge 1305, a hinge base 1310, and a hinge base lid 1315. The hinge 1305 is attached to the TOLED panel as shown in FIG. 5. The hinge 1305 has a lip surface 1325 to clamp the cover glass in place, and a rounded surface 1330 that matches the cover glass notch relief radius. The hinge 1305 includes cavities 1308 to receive ball-nose catches or detents 1335. Once embedded in the hinge 1305, the ball nose catches or detents 1335 designed to engage spring plungers 1340 to temporarily lock the hinge 1305 in place and prevent the hinge (and the TOLED panel) from rotating. A rotation lock set screw 1345 can be used to further lock the hinge and prevent the hinge from rotating.

As shown in FIG. 13A, the hinge base 1310 can be mounted onto the window's frame or mullion (shown as element 430 in FIG. 4) using rivet nuts 1350 and mounting screws 1355. A pin-in-slot mechanism 1360 allows a hinge pin 1365 to extend through a hole of the hinge base 1310 to engage and retain the hinge 1305 (and the TOLED panel). The pin-in-slot mechanism 1360 also allows to the hinge pin 1365 to be retracted to disengage the hinge 1305 so that the TOLED panel could be removed. The pin-in-slot mechanism 1360 includes a hinge pawl 1370 and a dowel pin 1375 used to attach the hinge pin 1365 to the hinge pawl 1370. Torsion springs 1380 maintain constant engagement of the hinge pin 1365. A lock set screw can be used to lock the hinge pin 1365 in place. A set screw 1390 is inserted in the hinge pawl 1370, and has an indented end to receive the hex key 1320. The hex key 1320 is used to activate the pin-in-slot mechanism 1360 to extend the hinge pin 1365 to engage and retain the hinge 1305 (and the TOLED panel) or to retract the hinge pin 1365 to disengage the hinge 1305 so that the TOLED panel could be removed.

As further shown in FIG. 13A, the hinge base lid 1315 could be attached to the hinge base 1310 using screws 1395.

Figure 13B:
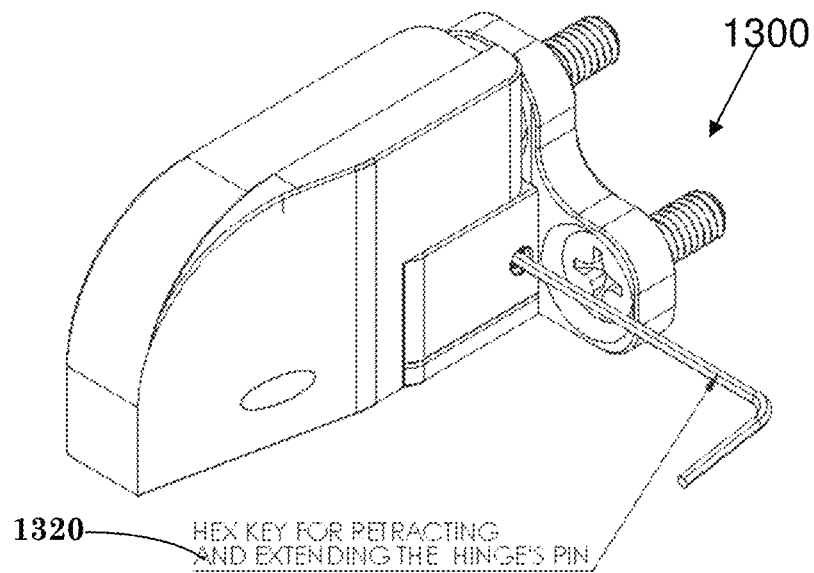
FIG. 13B is a perspective view of an assembled alternative hinge assembly shown in FIG. 13 according to one exemplary embodiment.

FIG. 13B is a perspective view of an assembled hinge assembly 1300 according to one exemplary embodiment. Hex key 1320 is inserted into the hinge assembly 1300 to activate the pin-in-slot mechanism (shown as element 1360 in FIG. 13A) for retracting or extending the hinge pin (shown as element 1365 in FIG. 13A).

Figure 13C:
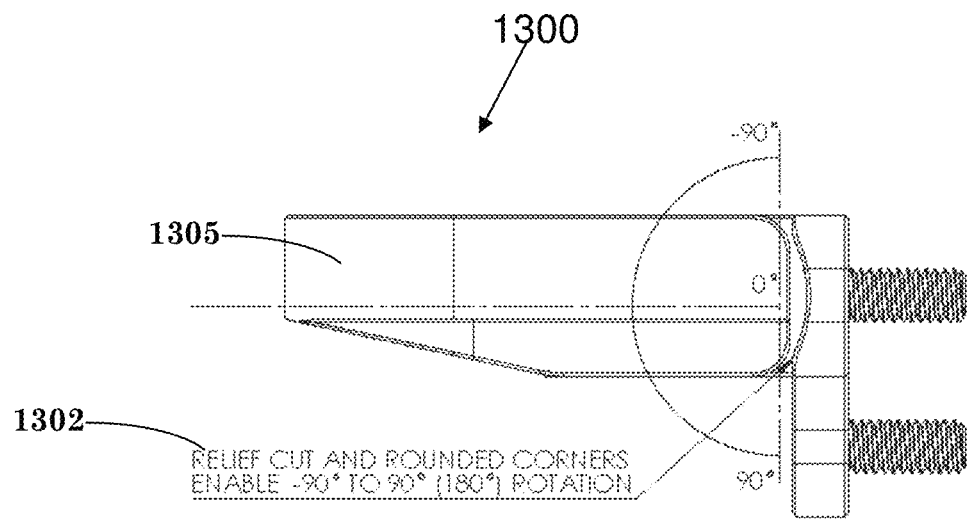
FIG. 13C is a top view of the hinge assembly shown in FIG. 14A according to one exemplary embodiment.

FIG. 13C is a top view of the hinge assembly 1300 according to one exemplary embodiment. The relief cut and rounded corners 1302 enable an approximately 180-degree rotation of the hinge 1305 in the range of about −90 degrees to about 90 degrees.

Figure 13D:
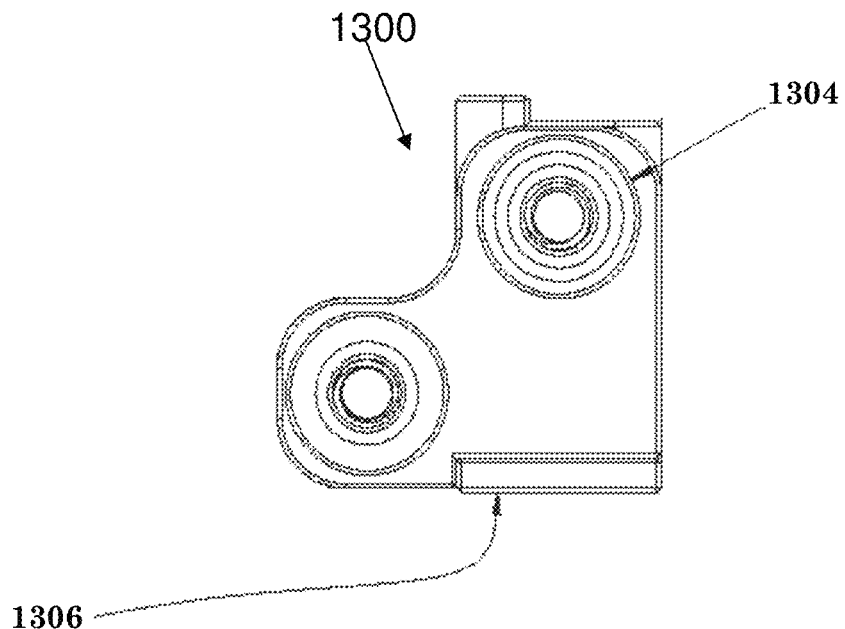
FIG. 13D is a back view of the hinge assembly shown in FIG. 14A according to one exemplary embodiment.

FIG. 13D is a back view of the hinge assembly 1300 according to one exemplary embodiment. The back of the hinge assembly includes circular cavities 1304 for flush mounting against the window's frame or mullion (shown as element 430 in FIG. 4). The flat surface 1306 allows side-to-side mounting for video wall applications.

Figure 13E:
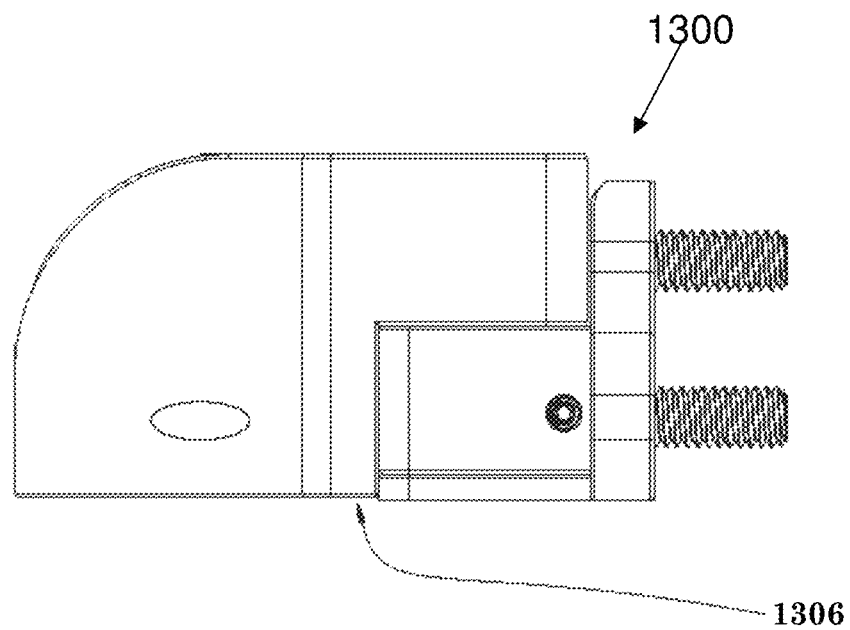
FIG. 13E is a side view of the hinge assembly shown in FIG. 14A according to one exemplary embodiment.

FIG. 13E is a side view of the hinge assembly 1300 according to one exemplary embodiment. The flat surface 1306 allows side-to-side mounting for video wall applications.

Figure 13F:
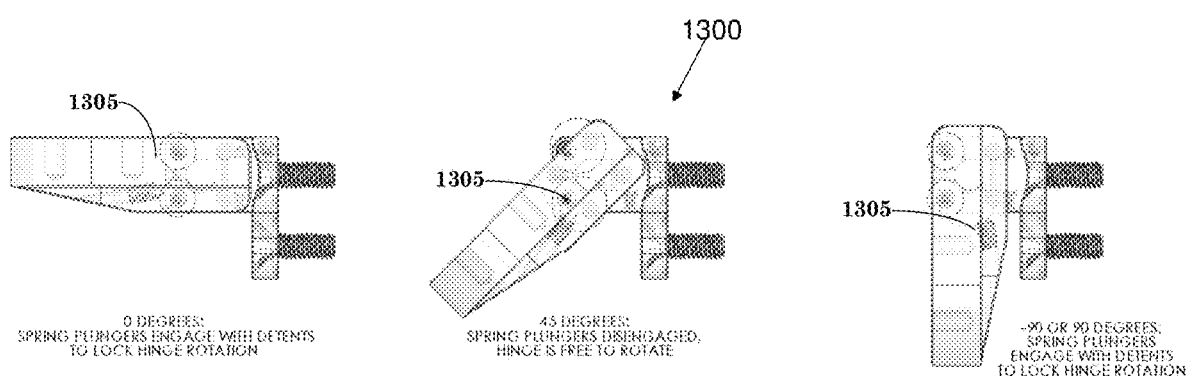
FIG. 13F illustrates various hinge rotation positions of the hinge assembly shown in FIGS. 13A-13E from a top view perspective according to one exemplary embodiment.

FIG. 13F illustrates various hinge rotation positions of the hinge assembly 1300 from a top view perspective according to one exemplary embodiment. As shown in the left illustration of FIG. 13F, when the hinge (or hinge mechanism) 1305 is at an approximately zero degree position, the spring plungers (shown as element 1340 in FIG. 13A) engage the catches or detents (shown as element 1335 in FIG. 13A) to temporarily lock the hinge (or hinge mechanism) 1305 in place and prevent the hinge 1305 (and the TOLED panel) from rotating. The middle illustration of FIG. 13F shows the hinge (or hinge mechanism) 1305 at an approximately 45-degrees position. At an approximately 45-degrees position, the spring plungers disengage and allow the hinge 1305 (and the TOLED panel) to rotate. The middle illustration of FIG. 13F shows the hinge 1305 at an approximately 90-degrees (or minus 90-degrees) position, where the spring plungers engage the catches or detents to temporarily lock the hinge (or hinge mechanism) 1305 in place and prevent the hinge (and the TOLED panel) from rotating.

Figure 13G:
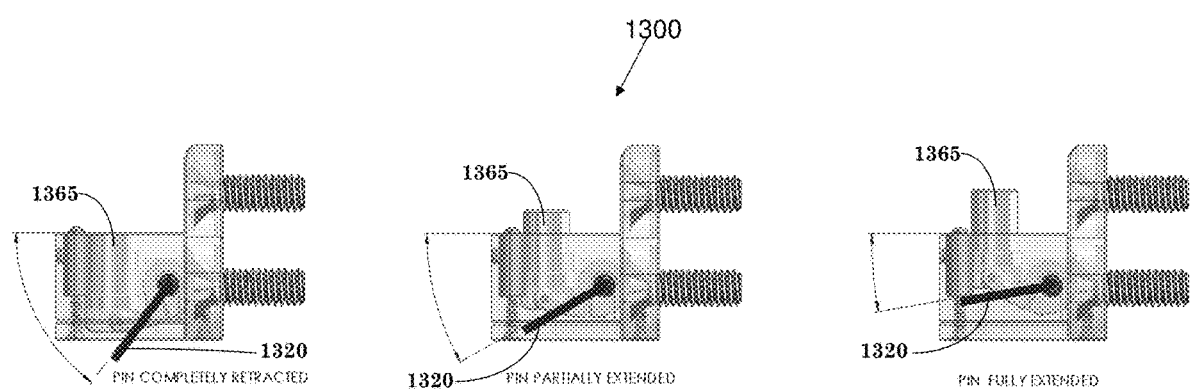
FIG. 13G illustrates various hinge pin engage/disengage positions of the hinge assembly shown in FIGS. 13A-13E from a side view perspective according to one exemplary embodiment.

FIG. 13G illustrates various hinge pin engage/disengage positions of the hinge assembly 1300 from a side view perspective according to one exemplary embodiment. The left illustration of 13G shows the hinge pin 1365 in a retracted position. The middle illustration of 13G shows the hex key 1320 being moved in a clock-wise direction to partially extend the hinge pin 1365. The right illustration of 13G shows the hex key 1320 being further move in a clock-wise direction to fully extend the hinge pin 1365.

Figure 14A:
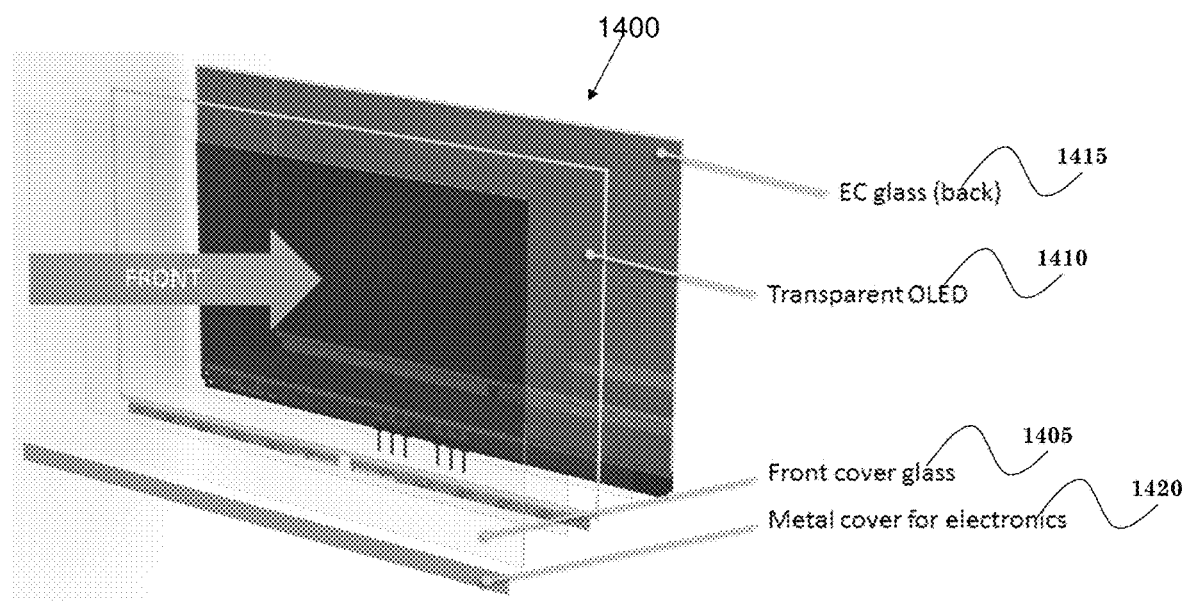
FIG. 14A illustrates a TOLED display assembly incorporating electrochromic (EC) glass for transparency control according to one exemplary embodiment.

As illustrated in FIGS. 12A and 12B and discussed in the above text describing the figures, in one embodiment, a privacy coating/film 1240 could be applied to block visibility of content or background from the back of the TOLED panel. FIG. 14A illustrates an alternative embodiment where electrochromic (EC) glass can be used to provide transparency control to the TOLED panel according to one exemplary embodiment. As shown in FIG. 14A, the front of the TOLED assembly 1400 includes the front cover glass 1405 attached to the TOLED panel 1410. The front of the TOLED assembly 1400 also includes a metal cover 1420 for electronics. In the back of the TOLED assembly 1400, the EC glass 1415 is attached to the back of the TOLED panel 1410.

TOLEDs are generally difficult to see when there is a bright background. In particular, for TOLEDs installed on windows facing the outside of a building, the image on the screen would typically be washed out by the background. The incorporation of EC glass (as illustrated in FIG. 14A) allows TOLED transparency to be controlled. In general, when content needs to be visible on the TOLED panel, the EC glass should be tinted. When the TOLED display is turned off or needs to be transparent, the EC glass should be disabled. Furthermore, the EC glass could be partially tinted to match lighting conditions. The tint of the EC glass can be controlled with sensors or overridden manually as needed. The TOLED and the EC glass can be mechanically coupled together via an optical bonding process; however, their functionality is independent of each other, i.e., one can be in an ON state while the other remains in an OFF state and vice versa.

EC glass can generally block up to 99% of ultraviolet (UV) light which would help to extend the life of the TOLED panel when installed on a window exposed to direct sunlight. By incorporating or integrating the EC glass into the TOLED assembly (shown as element 1400 in FIG. 14A), the transparency can be controlled regardless of where the TOLED panel (shown as element 1410 in FIG. 14A) is used (e.g., on a table top, or mounted on a window, etc.).

EC glass generally requires a low voltage (<3.3 v) electric current applied to it in order to start the tinting process. By regulating the voltage of the electric current, different tinting levels of the EC glass can be achieved. When no electric current is applied, the tinting on the EC glass disappears. Typical EC glass has a transmittance range of 60% (not tinted) to 2% (fully tinted).

Figure 14B:
FIGS. 14B-14F illustrate exemplary installations of a TOLED display on an EC smart window in various tinting states according to one exemplary embodiment.
Figure 14C:
Figure 14D:
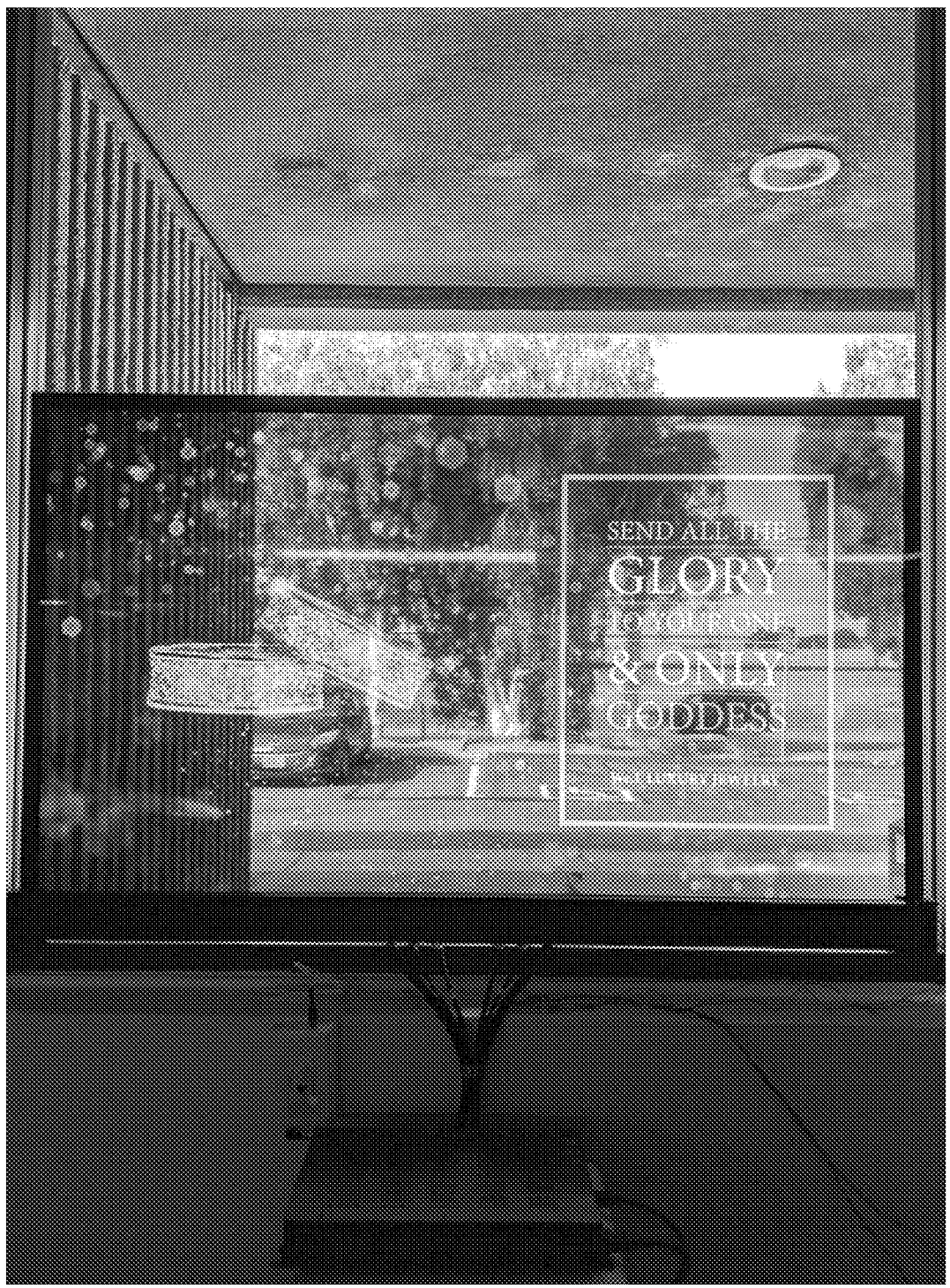

FIGS. 14B-14D illustrate exemplary installations of a TOLED display with electrochromic transparency control capabilities installed on a conventional office window. Different tinting states are shown according to one exemplary embodiment. FIG. 14B shows a TOLED display with transparency control that has its TOLED element turned OFF and its EC glass element set to zero percent tint (full transparency), installed on a conventional window, resulting in approximately 24 percent overall transparency. FIG. 14C shows a TOLED display with transparency control that has its TOLED element turned ON and its EC glass element set to zero percent tint (full transparency), installed on a conventional window, resulting in approximately 24 percent overall transparency. As shown in FIG. 14C, even though the TOLED display is turned on, the content on the TOLED display is washed out and difficult to see due to the bright background condition and the lack of tinting on the TOLED's EC glass.

Figure 14E:
Figure 14F:

FIG. 14D shows an exemplary TOLED display with transparency control that has its TOLED element turned ON and its EC glass element set to about 25 percent tint (75% of max possible transparency), installed on a conventional window, resulting in approximately 18 percent overall transparency. As shown FIG. 14D, the TOLED display is turned ON, and the content on the TOLED display is slightly more visible (less washed out) because the EC glass on the back of the TOLED is partially tinted. FIG. 14E shows a TOLED display with transparency control that has its TOLED element turned ON and its EC glass element set to ~75 percent tint (25% of max possible transparency), installed on a conventional window, resulting in less than 12 percent overall transparency. As shown in FIG. 14E, the content on the TOLED display is quite visible because there is significant tinting on the TOLED's EC glass element (~75%). The visibility of the content on the TOLED display is higher in FIG. 14D than in FIG. 14C since the EC glass in FIG. 14D has a higher tint level. FIG. 14F shows a TOLED display with transparency control that has its TOLED element turned OFF and its EC glass element set to ~75 percent tint (25% of max possible transparency), resulting in less than 12 percent overall transparency. As shown in FIG. 14F, the TOLED display is turned OFF, and transparency is somewhat obscured (especially in comparison to the transparency shown in FIG. 14B with zero percent tint) due to the higher tint level on the EC glass.

Projective Capacitive Touch (PCAP) is an established technology used on smartphones (e.g. iPhones). A PCAP panel generally consists of a pair of sensor films laminated to the rear of a cover glass and an integrated circuit (IC) controller to allow a computing device to interface with the PCAP panel. PCAP panels are typically bonded or attached to the front of displays. There are other touch technologies in the marketplace, including resistive, infrared, acoustic, etc.

Figure 15:
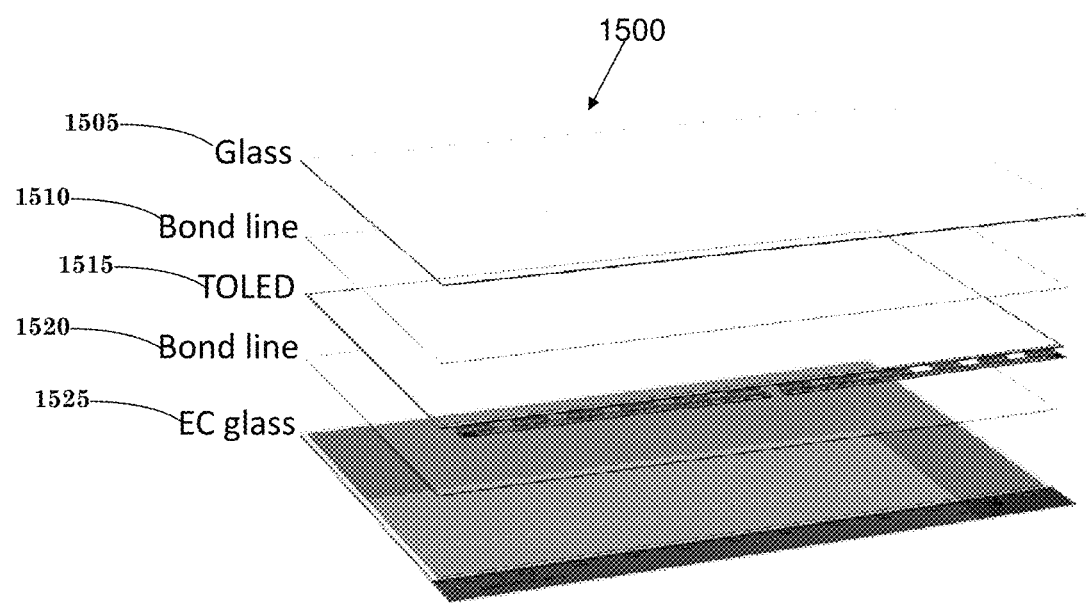
FIG. 15 illustrates a TOLED display assembly without a PCAP touch panel according to one exemplary embodiment.
Figure 16:
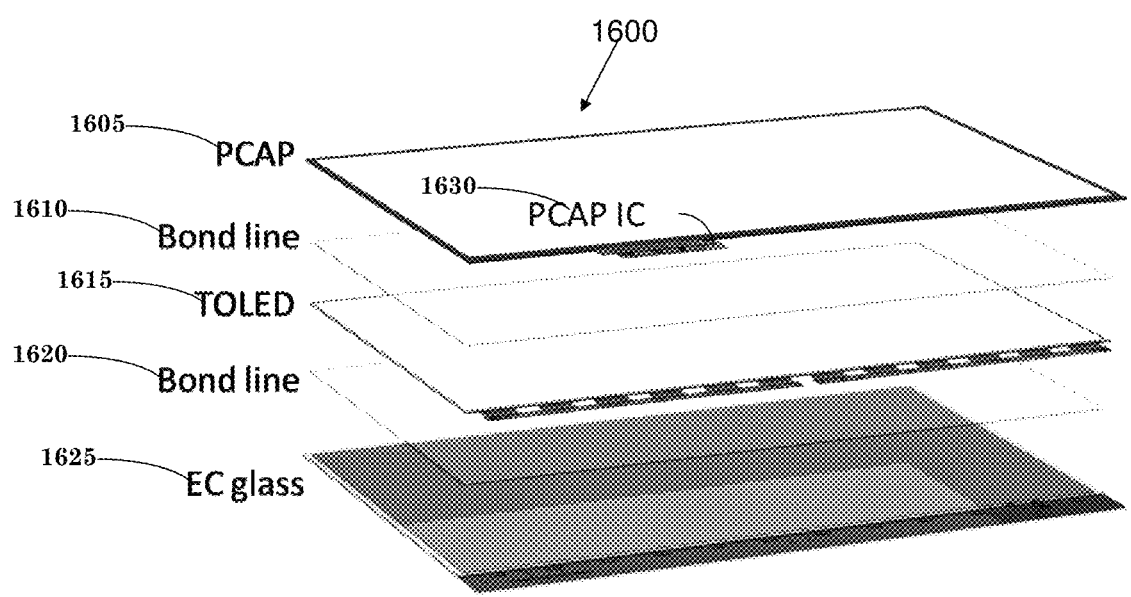
FIG. 16 illustrates a TOLED display assembly with a PCAP touch panel according to one exemplary embodiment.

FIG. 15 shows an exemplary TOLED display assembly 1500 with no PCAP touch capability. As shown in FIG. 15, the TOLED display assembly 1500 includes the cover glass 1505, a first bond layer 1510, a TOLED panel 1515, a second bond layer 1520, and an EC glass 1525. FIG. 16 shows an exemplary TOLED display assembly 1500 with PCAP touch capability. As shown in FIG. 16, the cover glass (shown as element 1505 in FIG. 15) is replaced with a PCAP touch panel 1605, which includes a cover glass, sensor, and a PCAP IC controller 1630 to control and/or drive the PCAP touch panel 1605. In addition to the PCAP touch panel 1605, the TOLED display assembly includes a first bond layer 1620, a TOLED panel 1615, a second bond layer 1625, and an EC glass 1625.

Figure 17:
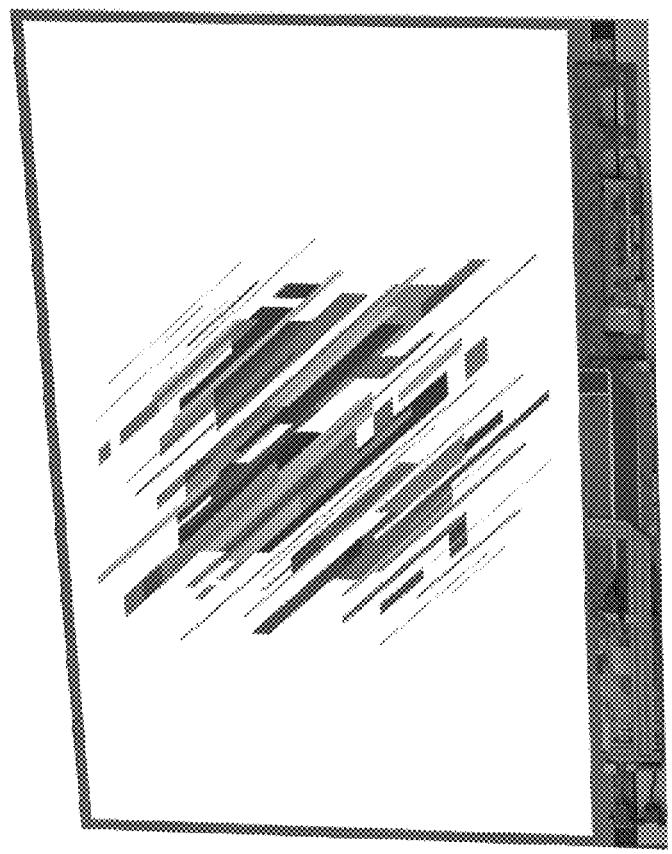
FIG. 17 illustrates a TOLED display assembly with a PCAP touch panel according to one exemplary embodiment and with a PCAP IC controller embedded in electronics for the TOLED display assembly.

With the addition of the PCAP touch panel 1605, the PCAP IC controller 1630 should be bundled into the TOLED display assembly 1600. As shown in FIG. 17, additional space needed to house the PCAP IC controller 1630 (shown in FIG. 16) provides sufficient space to house the rest of the electronics needed to control the TOLED panel 1615 (shown in FIG. 16) and the tinting and transparency of the EC glass 1625 (shown in FIG. 16).

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. While various embodiments of the invention have been described, it will be apparent to those of ordinary skill in the art that many more embodiments and implementations are possible within the scope of this invention. Moreover, various features and functionalities described in this application and Figures may be combined individually and/or plurality of features and functionalities with others. Accordingly, the invention is not to be restricted except in light of the attached claims and their equivalents. the known and customary practice within the art to which the invention pertains.

The invention claimed is:

1. A system for removable or semi-permanent installation of a transparent organic lighting diode (TOLED) display, comprising:
 a TOLED display that includes a TOLED panel with a front side and a back side, a cover glass coupled to the front side of the TOLED panel, and an electrochromic (EC) glass coupled to the back side of the TOLED panel to provide transparency control of the TOLED panel; and
 a top hinge assembly and a bottom hinge assembly used to rotatably couple the TOLED display to a support structure to facilitate rotation of the TOLED display to different positions and to provide relatively easy removal of the TOLED display,
 wherein each of the top hinge assembly and the bottom hinge assembly comprises:
  a hinge mechanism coupled to the TOLED display;
  a hinge base coupled to the support structure; and
  a removable hinge pin that is used to couple the hinge mechanism and the TOLED display to the hinge base and the support structure, wherein the hinge pin can be removed to disengage the hinge mechanism and the TOLED display from the hinge base and the support structure,
 wherein the removable hinge pin is coupled to a pin-in-slot mechanism capable of receiving a hex key, wherein the hex key is used to activate the pin-in-slot mechanism to enable the removable hinge pin to be extended to engage the hinge mechanism or to be retracted to disengage from the hinge mechanism.

2. The system of claim 1, wherein the TOLED panel is turned off and the EC glass is not tinted to allow transparency through the TOLED panel.

3. The system of claim 1, wherein the TOLED panel is turned on and the EC glass is tinted to block transparency through the TOLED panel and to allow content displayed on the TOLED to be visible.

4. The system of claim 1, wherein the EC glass has a transmittance range of 60% (not tinted) to 2% (fully tinted).

5. The system of claim 1, wherein a low voltage electric current is applied to the EC glass to start a tinting process.

6. The system of claim 1, wherein voltage electric current applied to the EC glass is regulated to control tinting levels of the EC glass.

7. The system of claim 1, further comprises:
 electronic components to control and power the TOLED panel, wherein the electronic components are housed inside the support structure.

8. The system of claim 1, further comprises:
 a Projective Capacitive Touch (PCAP) panel and a PCAP controller to facilitate touch control.

\* \* \* \* \*